United States Patent
Saenger

(10) Patent No.: US 9,477,025 B2
(45) Date of Patent: Oct. 25, 2016

(54) EUV LIGHT SOURCE FOR GENERATING A USED OUTPUT BEAM FOR A PROJECTION EXPOSURE APPARATUS

(71) Applicant: Carl Zeiss SMT GmbH, Oberkochen (DE)

(72) Inventor: Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/788,075

(22) Filed: Jun. 30, 2015

(65) Prior Publication Data
US 2015/0323874 A1    Nov. 12, 2015

Related U.S. Application Data

(63) Continuation of application No. PCT/EP2014/052405, filed on Feb. 7, 2014.

(60) Provisional application No. 61/766,165, filed on Feb. 19, 2013.

(30) Foreign Application Priority Data

Feb. 19, 2013    (DE) .................. 10 2013 202 590

(51) Int. Cl.
G03B 27/72    (2006.01)
G03B 27/54    (2006.01)
(Continued)

(52) U.S. Cl.
CPC ........... *G02B 5/3083* (2013.01); *G02B 5/0891* (2013.01); *G02B 5/3091* (2013.01);
(Continued)

(58) Field of Classification Search
CPC ........... G03F 7/70191; G03F 7/76566; G03F 7/70058
USPC .................. 355/52, 53, 55, 67–71
See application file for complete search history.

(56) References Cited

U.S. PATENT DOCUMENTS 5,453,814 A    9/1995    Aiyer
5,896,438 A    4/1999    Miyake et al.
(Continued)

FOREIGN PATENT DOCUMENTS

DE    103 01 475 A1    7/2004
DE    103 58 225 B3    6/2005
(Continued)

OTHER PUBLICATIONS

German Office Action, with translation thereof, for corresponding DE Appl No. 10 2013 202 590.4, dated Oct. 10, 2013.
(Continued)

*Primary Examiner* — Hung Henry Nguyen
(74) *Attorney, Agent, or Firm* — Fish & Richardson P.C.

(57) ABSTRACT

A light source includes: a generation device configured to generate a first EUV beam having a polarization that is a superimposition of two linearly polarized waves with directions of polarization that are perpendicular to each other and that have a phase difference with respect to each other that is non-zero and not an integral multiple of π; and a polarization setting device configured to interact with the first EUV beam to provide a second EUV beam by exerting an effect on the first EUV beam that is linearly polarizing with respect to the direction of polarization to set a polarization of the second EUV beam.

11 Claims, 7 Drawing Sheets

(51) Int. Cl.
  *G02B 5/30* (2006.01)
  *G02B 5/08* (2006.01)
  *G03F 7/20* (2006.01)
  *G02B 27/09* (2006.01)
  *G02B 27/28* (2006.01)
  *G21K 1/06* (2006.01)
  *H05G 2/00* (2006.01)

(52) U.S. Cl.
  CPC ......... *G02B27/0977* (2013.01); *G02B 27/286* (2013.01); *G03F 7/70058* (2013.01); *G03F 7/70091* (2013.01); *G03F 7/70191* (2013.01); *G03F 7/70308* (2013.01); *G03F 7/70425* (2013.01); *G03F 7/70566* (2013.01); *G21K 1/062* (2013.01); *H05G 2/001* (2013.01)

(56) References Cited

U.S. PATENT DOCUMENTS

| | | | |
|---|---|---|---|
| 6,999,172 B2 | 2/2006 | Masaki et al. | |
| 7,474,733 B1 | 1/2009 | Yamamoto | |
| 7,982,854 B2* | 7/2011 | Mann | G03F 7/70058 355/67 |
| 2003/0043359 A1 | 3/2003 | Naulleau | |
| 2004/0184019 A1 | 9/2004 | Totzeck et al. | |
| 2006/0146384 A1 | 7/2006 | Schultz et al. | |
| 2006/0158288 A1 | 7/2006 | Rossmanith et al. | |
| 2006/0192149 A1 | 8/2006 | Van Dam et al. | |
| 2006/0192937 A1* | 8/2006 | Kerkhof | G03F 7/70566 355/71 |
| 2008/0192225 A1 | 8/2008 | Mann et al. | |
| 2011/0001947 A1 | 1/2011 | Dinger et al. | |
| 2012/0281816 A1 | 11/2012 | Kuroda et al. | |
| 2014/0132942 A1 | 5/2014 | Saenger et al. | |
| 2014/0362360 A1 | 12/2014 | Saenger | |

FOREIGN PATENT DOCUMENTS

| | | |
|---|---|---|
| DE | 10 2011 079 837 A1 | 1/2013 |
| DE | 10 2012 203 950 A1 | 9/2013 |
| EP | JP H07-283133 A | 10/1995 |
| EP | 1 225 481 A2 | 12/2001 |
| WO | WO 2009/121438 | 10/2009 |

OTHER PUBLICATIONS

International Search Report for corresponding PCT Appl No. PCT/EP2014/052405, dated Aug. 19, 2014.

Koide et al., "Polarization characterization of circularly polarized vacuum-ultraviolet and soft-x-ray helical undulator radiation," Review of Scientific Instruments, American Institute of Physics, 66(1995) February, Part II, No. 2, Woodbury, NY, US.

Schaefers et al., "Soft-X-ray polarimeter with multilayer optics: complete analysis of the polarization state of light," Applied Optics, vol. 38, No. 19, Jul. 1999.

Qiu et al. "Surface magneto-optic Kerr effect," Review of Scientific Instruments, American Institute of Physics, vol. 71, No. 3, Mar. 2000.

La-O-Vorakiat et al., "Magneto-Optical Kerr Effect Probed Using Ultrafast High-Order Harmonic Euv Light," OSA/CLEO/IQEC 2009.

Uwe Schindler, "Ein Supraleitender Undulator Mit Elektrisch Umschaltbarer Helizität," Aug. 2004, including English Abstract at p. iii.

Wang Zhanshan et al. "Complete polarization analysis of extreme ultraviolet radiation with a broadband phase retarder and analyzer," Applied Physics Letter 90, 081910 (2007).

* cited by examiner

EUV LIGHT SOURCE FOR GENERATING A USED OUTPUT BEAM FOR A PROJECTION EXPOSURE APPARATUS

CROSS-REFERENCE TO RELATED APPLICATIONS

The present application is a continuation of, and claims benefit under 35 USC 120 to, international application PCT/EP2014/052405, filed Feb. 7, 2014, which claims benefit under 35 USC 119 of German Application No. 10 2013 202 590.4, filed Feb. 19, 2013. International application PCT/EP2014/052405 also claims priority under 35 USC 119(e) to U.S. Provisional Application No. 61/766,165, filed Feb. 19, 2013. The contents of international application PCT/EP2014/052405 and German patent application DE 10 2013 202 590.4 are incorporated by reference.

The invention relates to an EUV light source for generating a used output beam of EUV illumination light for a projection exposure apparatus for projection lithography. Furthermore, the invention relates to a used polarization setting device for such a light source, an illumination system comprising such a light source, an optical system comprising such an illumination system, a projection exposure apparatus comprising such an optical system, and a method for producing a micro- and/or nanostructured component using such a projection exposure apparatus.

A projection exposure apparatus comprising an illumination system is known from WO 2009/121 438 A1. An EUV light source is known from DE 103 58 225 B3. Further references from which an EUV light source is known can be found in WO 2009/121 438 A1. EUV illumination optical units are furthermore known from US 2003/0043359 A1 and U.S. Pat. No. 5,896,438. Variants for generating polarized EUV light and for geometrical polarization rotation are known from U.S. Pat. No. 6,999,172 B2 and US 2008/0192225 A1.

It is an object of the present invention to develop an EUV light source such that an improved output beam for resolution-optimized illumination is provided.

This object is achieved according to the invention via an EUV light source for generating a used output beam of EUV illumination light for a projection exposure apparatus for projection lithography that includes an EUV generation device which generates an EUV raw output beam, wherein the EUV raw output beam has a polarization described by a superimposition of two linearly polarized waves, the directions of polarization of which are perpendicular to one another and have a phase difference with respect to one another that is neither vanishing nor an integral multiple of $\pi$. The light source also includes a used polarization setting device which, for the purpose of setting the polarization of the used output beam, exerts on the raw output beam an effect that is linearly polarizing with regard to the direction of polarization. The used polarization setting device has at least one phase retarding component which is arranged in the beam path of the raw output beam and which exerts a phase shifting effect on the two linearly polarized waves which are superimposed to form the polarization of the raw output beam.

It has been recognized that linearly polarized EUV illumination light can be used particularly well for resolution-optimized illumination. The used polarization setting device according to the invention provides such linearly polarized EUV illumination light in the form of a used output beam. This affords the possibility of generating linearly polarized light with an initially arbitrarily predefinable polarization orientation. This results in a polarization predefinition with the lowest possible transmission loss caused by the polarization setting. The EUV generation device of the light source can be embodied as an undulator. Deflection magnets of the undulator can be fashioned in a displaceable manner. The displacement of the deflection magnets can be used to generate a circularly or elliptically polarized raw output beam. The EUV light source can be used to realize an illumination of an illumination field with the used output beam with an exit pupil of an illumination device which is linearly polarized at least locally. In particular, use of downstream components of an illumination optical unit makes it possible to achieve a tangentially polarized illumination (TE polarization) of an illumination field with the used output beam. In the case of the tangentially polarized illumination, a linear polarization direction of the used output beam is always polarized perpendicularly to a plane of incidence on the illumination field, independently of the illumination angle. The EUV light source additionally makes it possible to set linearly polarized dipole illuminations which obviate an additional transmission loss on account of a polarization setting. In the case of such a linearly polarized dipole illumination, an illumination field is illuminated from two main directions from which the illumination field is impinged on in each case by linearly polarized illumination light.

The EUV light source can be embodied in an electron-beam-based fashion, for example as an X-ray source on the basis of a free electron laser (FEL). Alternatively, the EUV light source can also be embodied as a plasma source, wherein the EUV radiation is generated either with the aid of a driver laser (LPP source) or with the aid of a gas discharge (GDPP source). A synchrotron can also be used as an EUV light source. In the case of an electron-beam-based EUV light source, a circularly or elliptically polarized EUV raw output beam can be generated efficiently.

The EUV light source can have a changeover unit for changing over between a circular polarization and an elliptic polarization of the EUV raw output beam. The changeover unit can be realized by a corresponding arrangement of deflection magnets of an undulator. The used polarization setting device and, in particular, the phase retarding component can be designed as a multilayer arrangement comprising a plurality or multiplicity of individual layers, wherein individual layers of different materials succeed one another. Materials used can include at least two of the materials molybdenum (Mo), ruthenium (Ru), boron carbide (B$_4$C) or silicon (Si). The individual layers can be made so thin that the multilayer arrangement has overall a thickness, that is to say a total layer thickness, of the order of magnitude of less than 1 µm. The total layer thickness can be, in particular, of the order of magnitude of a few 100 nm, and can be, for example, in the range of between 200 nm and 500 nm. For example, 10 to 200 individual layers of this type, in particular 10 to 100 of such individual layers, can be used, for example 20 to 50 of such individual layers.

A net phase shift between the two linearly polarized waves which are superimposed to form the polarization of the raw output beam can be less than half a wavelength $\lambda$ of the used output beam of the EUV illumination light. This can be realized with comparatively low losses of EUV illumination light. The net phase shift takes account of the fact that an integral multiple of $2\pi$ (corresponding to the wavelength $\lambda$) in the case of the difference between the phases of the two linearly polarized waves which are superimposed to form the polarization of the raw output beam is ineffective. The net phase shift is therefore always less than $2\pi$. The polarization setting by the used polarization setting device can be optimized via birefringent EUV optical units by the splitting of a required total birefringence, for example a net phase shift in the range of half a wavelength $\lambda$ of the used output beam of the EUV illumination light, among various phase shifting individual components each having a smaller phase shifting effect, for example in the range of in each case ⅛ of the wavelength $\lambda$. This can furthermore lead to a reduction of intensity losses of the used output beam.

The EUV raw output beam can be circularly polarized. A circular polarization of the raw output beam has proved to be a suitable output polarization for generating predefined illumination-polarization geometries.

At least one reflective phase retarding component can be a reflective component. This can be realized with low throughput losses for the EUV illumination light.

A reflection coating with a net phase shift can, upon the raw output beam passing through once, leads to a net phase retardation of less than one quarter of the wavelength $\lambda$ of the used output beam of the EUV illumination light. This affords the possibility of influencing polarization with particularly low transmission losses. The net phase shift can be less than $\lambda/5$, than $\lambda/6$, than $\lambda/7$, can be $\lambda/8$, for example, and can be even less, for example $\lambda/10$, $\lambda/12$, $\lambda/16$ or even less. The reflection coating can in turn be fashioned as a multi-layer arrangement, as already explained above.

With at least one phase retarding component arranged in a rotatable manner about an axis which is perpendicular to a reflection surface of the phase retarding component, it is possible to predefine a direction of a linear polarization set by the phase retarding component. A corresponding rotatable arrangement can also be realized in the case of a transmissive phase retarding component.

A parallel arrangement of reflective phase retarding components which each reflect different partial beams of the raw output beam enables partial beams of the raw output beam to be influenced differently in a predefined manner and thus enables differently polarized used partial beams to be defined. The reflective phase retarding components can differ in terms of the alignment of their respective optical axis that predefines the phase influencing effect. In the case of such a configuration, differently polarized used partial beams can be generated even in the case of a static arrangement of the phase retarding components. By way of example, a different linear polarization of the used partial beams arises depending on which of the reflective phase retarding components is impinged on.

An optical selection component can be in the beam path of the raw output beam upstream of the reflective phase retarding components, by which it is possible to predefine which of the reflective phase retarding components is impinged on by a given partial beam of the raw output beam. This increases the flexibility in the predefinition of polarization. The optical selection component can be realized by at least one tiltable mirror in the beam path of the raw output beam.

In the case of a series arrangement of the reflective phase retarding components which reflect the same partial beam of the raw output beam, it is possible to distribute a phase shifting effect among a plurality of phase retarding components, such that the individual phase retarding components can operate with even smaller net phase shifts, for example with net phase shifts which are less than $\lambda/10$, can be $\lambda/16$ and can be even less. Such small net phase shifts can be realized with a relatively great multiplicity of materials or material combinations for the respective phase retarding component.

The advantages of a transmissive phase retarding component correspond to those which have already been explained above with reference to the reflective phase retarding components. A plurality of transmissive phase retarding components for influencing a partial beam in each case, that is to say a series arrangement, or else a parallel arrangement of a plurality of transmissive phase retarding components for influencing different partial beams is also possible. Such a plurality of transmissive phase retarding components can in turn be individually rotatable or can have differently oriented optical axes that predefine the phase influencing effect.

A net phase shift of the phase retarding component of the used polarization setting device according to the invention can also be brought about by the magneto-optical Kerr effect. The polarization property of the illumination and imaging light can be influenced via the reflective surface—forming the magnetic field—of the mirror in particular by the magneto-optical Kerr effect, by the surface magneto-optical Kerr effect, by the diffractive magneto-optical Kerr effect, by the nonlinear magneto-optical Kerr effect or by the magnetoelectric effect. In this case, it is possible to use materials and mirror and/or magnetic field geometries which are known from the literature regarding the magneto-optical Kerr effect. Examples thereof can be found in the literature inter alia in Qiu et al., Review of Scientific Instruments, Vol. 71, No. 3, 2000, pages. 1243 to 1255 and in La-O-Vorakiat et al., Magneto-Optical Kerr Effect probed using Ultrafast High-Order Harmonic EUV Light, 2009 USA/CLEO/IQEC, Document CPDA5.pdf.

The advantages of a used polarization setting device for influencing the polarization of a raw output beam of an EUV light source discussed above correspond to those which have already been explained above in connection with the EUV light source.

The advantages of an illumination system including an EUV light source discussed herein, of an optical system including such an illumination system, of a projection exposure apparatus including such an optical system, of a production method that uses such a projection exposure apparatus, and of a micro- and/or nanostructure component produced thereby correspond to those which have already been explained above with reference to the EUV light source according to the invention. The micro- and/or nanostructured component can be in particular a semiconductor component, for example a microchip, in particular a memory chip. An image-side numerical aperture of the projection optical unit of the optical system can be greater than 0.4 and can be greater than 0.5.

The used polarization setting device can be part of the EUV light source, but can also be part of the illumination optical unit.

The used polarization setting device as part of the illumination optical unit can be embodied in the same way as already explained above in connection with the used polarization setting device as part of the EUV light source. In the case, too, of the used polarization setting device as part of the illumination optical unit, a net phase shift of the used polarization setting device or of individual components thereof can result which is less than half a wavelength of the used output beam of the EUV illumination light. The general principle of a polarization setting for generating at least locally linear polarization from circularly or elliptically polarized input light can be realized both in the case of the generation of a used output beam on the light source side or else in the further course of a raw output beam through the illumination optical unit.

Exemplary embodiments of the invention are explained in greater detail below with reference to the drawing, in which:

FIG. 1 shows schematically and, with regard to an illumination optical unit, in meridional section a projection exposure apparatus for EUV projection lithography;

FIG. 2 schematically shows a light source of the projection exposure apparatus with a used polarization setting device having a transmissive phase retarding component;

FIG. 3 schematically shows a light source of the projection exposure apparatus with a used polarization setting device having a reflective phase retarding component;

Figure 2:
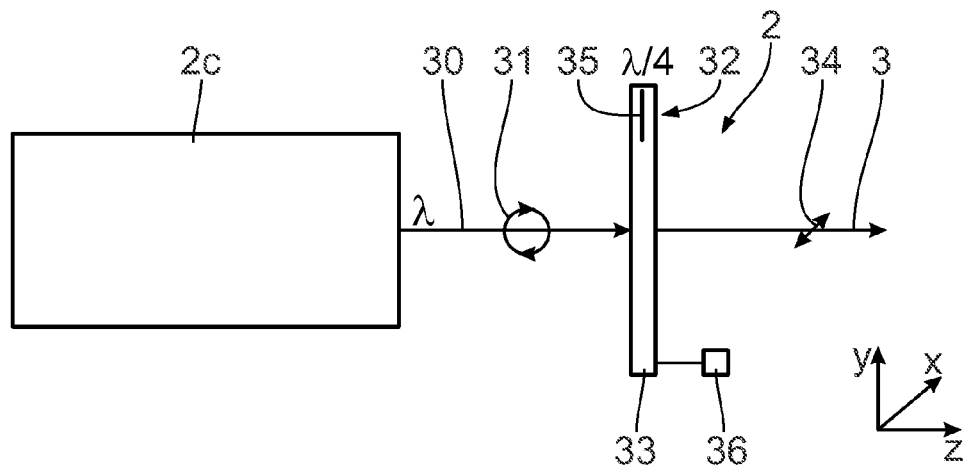
Figure 3:
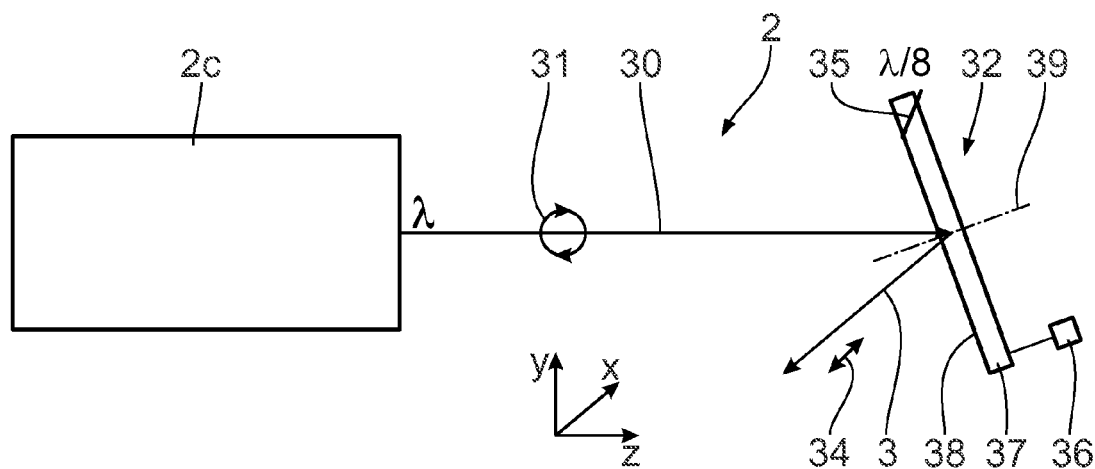
Figure 8:
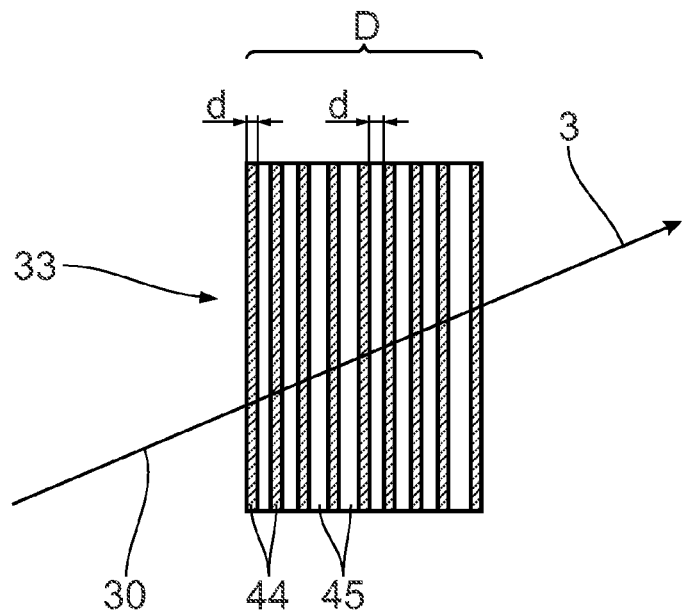
Figure 9:
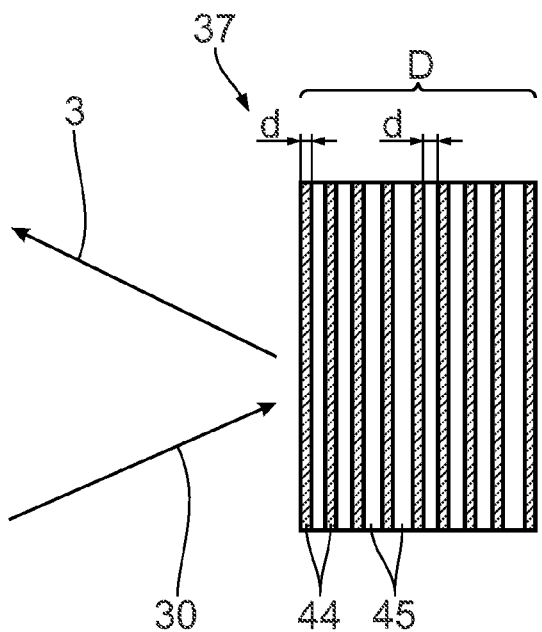
Figure 10:
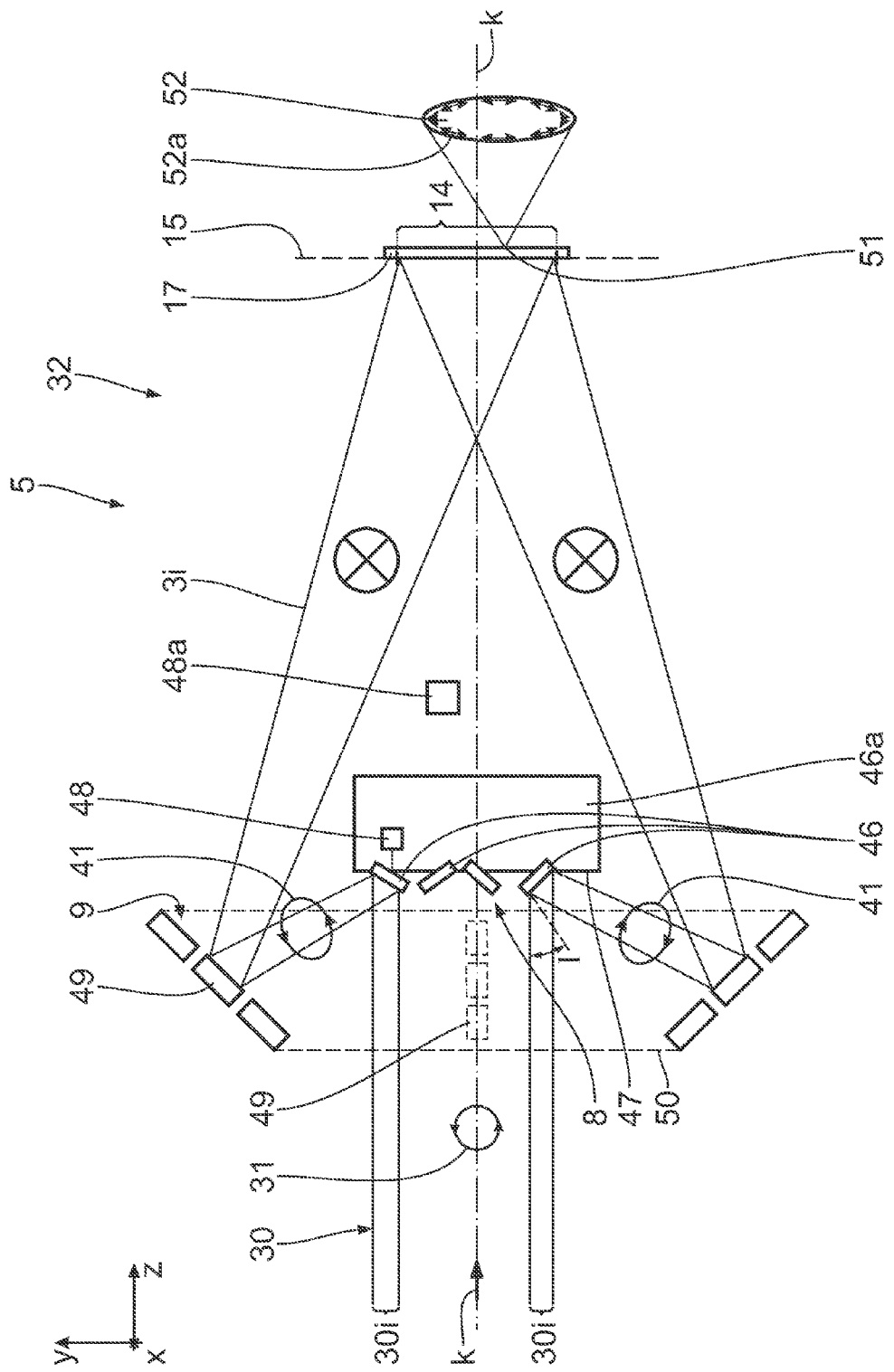
Figure 11:
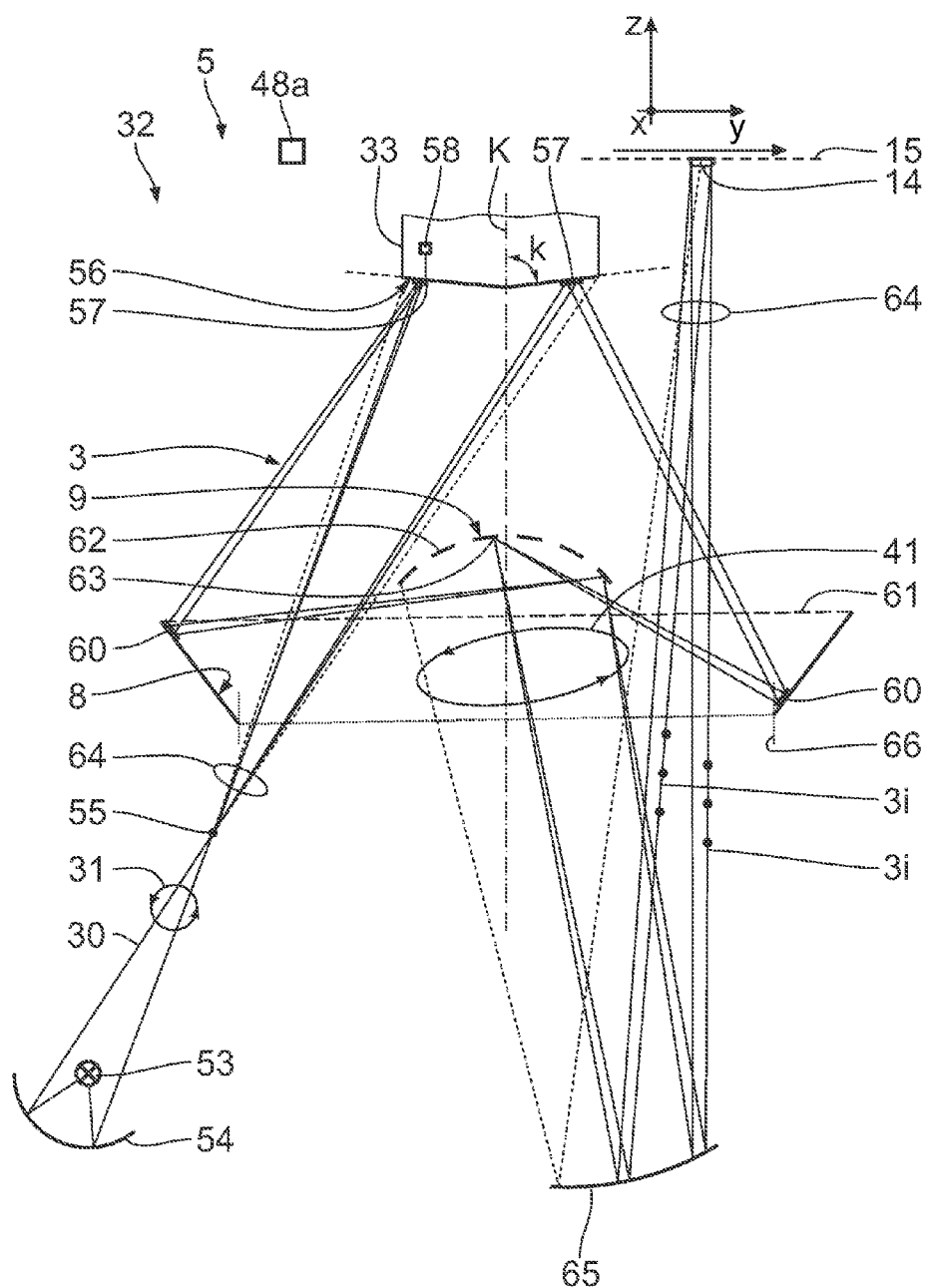

FIGS. 8 and 9 show in greatly enlarged manner cross sections through the phase retarding components according to FIG. 2 (transmissive) and according to FIG. 3 (reflective); and FIGS. 10 and 11 show further variants of used polarization setting devices in which facets of, for example, a field facet mirror and/or a pupil facet mirror are designed as reflective phase retarding components which in pairs sequentially in each case reflect the same partial beam of the raw output beam.

A projection exposure apparatus 1 for microlithography serves for producing a micro- and/or nanostructured electronic semiconductor component. A light or radiation source 2 emits EUV radiation in the wavelength range of, for example, between 3 nm and 30 nm, in particular between 3 nm and 15 nm. The light source 2 is embodied as a free electron laser (FEL). This is a synchrotron radiation source which generates coherent radiation with very high brilliance. Prior publications which describe FELs of this type are indicated in WO 2009/121 438 A1. A light source 2 which can be used, for example, is described in Uwe Schindler "Ein supraleitender Undulator mit elektrisch umschaltbarer Helizität" ["A Superconducting Undulator having Electrically Switchable Helicity"], Research Center Karlsruhe in the Helmholtz Association, Scientific Reports, FZKA 6997, August 2004, and in DE 103 58 225 B3.

The EUV light source 2 has an electron beam supply device 2a for generating an electron beam 2b and an EUV generation device 2c. The latter is supplied with the electron beam 2b via the electron beam supply device 2a. The EUV generation device 2c is embodied as an undulator. The undulator can optionally have undulator magnets that are adjustable by displacement.

Some exemplary operating parameters for the light source 2 are summarized below: the light source 2 has an average power of 2.5 kW. The pulse frequency of the light source 2 is 30 MHz. Each individual radiation pulse then carries an energy of 83 µJ. Given a radiation pulse length of 100 fs, this corresponds to a radiation pulse power of 833 MW.

A used radiation beam 3, also designated as used output beam, is used as illumination light for illumination and imaging within the projection exposure apparatus 1. The used radiation beam 3 is illuminated within an aperture angle 4, adapted to an illumination optical unit 5 of the projection exposure apparatus 1, with the aid of a scanning device 6. The used radiation beam 3 has, proceeding from the light source 2, a divergence that is less than 5 mrad. The scanning device 6 is arranged in an intermediate focal plane 7 of the illumination optical unit 5. Downstream of the scanning device 6, the used radiation beam 3 firstly impinges on a field facet mirror 8.

The used radiation beam 3 has, in particular, a divergence that is less than 2 mrad and is preferably less than 1 mrad. The spot size of the used radiation beam on the field facet mirror 8 is approximately 4 mm.

As an alternative to the scanning device 6, it is also possible to use another mechanism for increasing an etendue of the used radiation beam 3.

After reflection at the field facet mirror 8, the used radiation beam 3 split into partial beams or subbeams assigned to individual field facets (not illustrated) of the field facet mirror 8 impinges on a pupil facet mirror 9. Pupil facets (not illustrated in FIG. 1) of the pupil facet mirror 9 are round. Each subbeam of the used radiation beam 3 that is reflected by one of the field facets is assigned one of the pupil facets, such that a respective facet pair that is impinged on and comprises one of the field facets and one of the pupil facets predefines an illumination channel or beam guiding channel for the associated subbeam of the used radiation beam 3. The channel-by-channel assignment of the pupil facets to the field facets is effected depending on a desired illumination by the projection exposure apparatus 1. The output beam 3 is therefore guided for predefining individual illumination angles along the illumination channel sequentially via pairs comprising in each case one of the field facets and in each case one of the pupil facets. In order to head toward respectively predefined pupil facets, the field facet mirrors are each tilted individually.

Via the pupil facet mirror 9 and a downstream transfer optical unit 13, which consists of three EUV mirrors 10, 11, 12, the field facets are imaged into an illumination or object field 14 in a reticle or object plane 15 of a projection optical unit 16 of the projection exposure apparatus 1. The EUV mirror 12 is embodied as a mirror for grazing incidence (grazing incidence mirror).

From the sequence of the individual illumination angles that is predefined via an individual facet pair, an illumination angle distribution of the illumination of the object field 14 that is brought about via the illumination optical unit 5 arises via the scanned integration of all the illumination channels that is brought about via an illumination of the field facets of the field facet mirror 8 with the aid of the scanning device 6.

In an embodiment of the illumination optical unit 5 that is not illustrated, in particular given a suitable position of an entrance pupil of the projection optical unit 16, the mirrors 10, 11 and 12 can also be dispensed with, which leads to a corresponding increase in the transmission of the projection exposure apparatus 1 for the used radiation beam 3.

A reticle 17 that reflects the used radiation beam 3 is arranged in the object plane 15 in the region of the object field 14. The reticle 17 is carried by a reticle holder 18, which is displaceable in a manner driven via a reticle displacement drive 19.

The projection optical unit 16 images the object field 14 into an image field 20 in an image plane 21. A wafer 22 is arranged in the image plane 21 during the projection exposure, the wafer bearing a light-sensitive layer that is exposed during the projection exposure via the projection exposure apparatus 1. The wafer 22 is carried by a wafer holder 23, which is in turn displaceable in a manner controlled via a wafer displacement drive 24.

An xyz coordinate system is used hereinafter in order to facilitate the representation of positional relationships. The x-axis is perpendicular to the plane of the drawing in FIG. 1 and points into the latter. The y-axis runs toward the right in FIG. 1. The z-axis runs downward in FIG. 1. In the overall illustrations of the projection exposure apparatus 1, the z-direction runs perpendicularly to the image plane 21. In the illustrations relating to the light source 2 and/or illumination-optical components, the z-direction runs in a main propagation direction of the EUV light.

Figure 1:
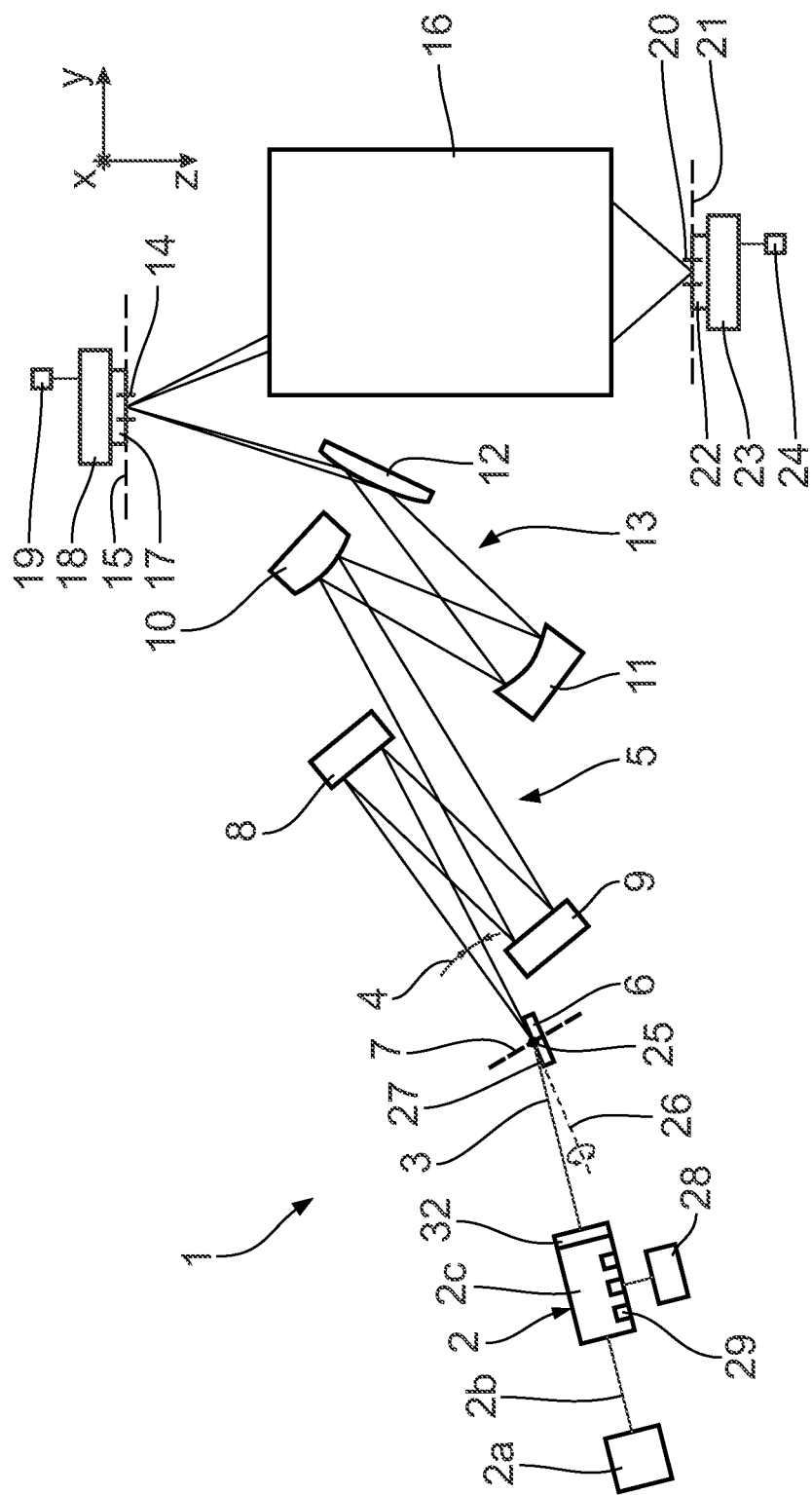

In the case of the projection exposure apparatus 1 according to FIG. 1, the field facet mirror 8 is the first facet mirror and the pupil facet mirror 9 is the second facet mirror in the beam path of the illumination light 3. The facet mirrors 8, 9 can also interchange their function. In this regard, the first facet mirror 8 can be a pupil facet mirror, which is then arranged in a pupil plane of the projection optical unit 16 or in a conjugate plane with respect thereto, and the second facet mirror 9 can be a field facet mirror, which is then arranged in a field plane that is optically conjugate with respect to the object plane 15.

During the projection exposure, both the reticle and the wafer are scanned in a synchronized manner in the y-direction in FIG. 1 by corresponding driving of the reticle displacement drive 19 and of the wafer displacement drive 24. During the projection exposure, the wafer is scanned at a scanning rate of typically 600 mm/s in the y-direction. The synchronized scanning of the two displacement drives 19, 24 can be effected independently of the scanning operation of the scanning device 6.

The long side of the field facets is perpendicular to the scanning direction y. The x/y aspect ratio of the field facets corresponds to that of the slot-shaped object field 14, which can likewise be embodied in a rectangular or curved fashion.

The scanning device 6 is a scanning mirror which reflects the used radiation beam 3 in a grazing manner and which is tiltable about a line scan axis 25, which runs parallel to the x-axis in FIG. 1, and about a line advance axis 26, which is perpendicular thereto and lies in the yz-plane in FIG. 1. Both axes 25, 26 lie in a reflective mirror surface 27 of the scanning device 6.

The EUV light source 2 has a raw polarization setting device 28, which, for the purpose of setting the polarization of a raw output beam 30 (cf. e.g. FIG. 2), exerts a deflecting effect on the electron beam 2b in the EUV generation device 2c. The raw polarization setting device 28 is realized by a corresponding arrangement of deflection magnets 29 of the undulator 2c. Some of the deflection magnets 29 as part of the undulator 2c are indicated schematically in FIG. 1. This arrangement of the deflection magnets 29 is such that the EUV raw output beam 30 (cf. FIG. 2) is circularly polarized, which is indicated by a corresponding polarization symbol 31 (circular arrow) in FIG. 2. A corresponding arrangement of the deflection magnets 29 for realizing a circularly polarized EUV output beam is described in the Schindler reference already cited above. The optional adjustability of the undulator magnets of the undulator can be used in a targeted manner for changing over from linearly to circularly polarized EUV light and/or from circularly to elliptically polarized EUV light. In this case, the raw polarization setting device 28 simultaneously serves as a changeover unit for changing over between the different polarization states of the EUV raw output beam 30.

A circular and also an elliptic polarization can be described by a superimposition of two linearly polarized transverse waves, the directions of polarization of which are perpendicular to one another. In the case of circular polarization, these two linearly polarized waves have a phase difference of $\pi/2$ and identical amplitudes. In the case of elliptic polarization, neither a circular nor a linear polarization is present. The elliptic polarization arises as a result of a superimposition of the two linearly polarized waves having a phase difference with respect to one another which is neither vanishing nor an integral multiple of $\pi$, wherein the special case of circular polarization of a phase difference of $\pi/2$ and identical amplitudes of the two linearly polarized waves is not present either.

The EUV light source 2 furthermore has a used polarization setting device 32, which, for the purpose of setting the polarization of the used output beam 3, exerts a polarizing effect on the raw output beam 30. Variants of the used polarization setting device 32 are explained in greater detail below.

In the case of the embodiment according to FIG. 2, the used polarization setting device 32 has a transmissive phase retarding component 33 in the form of a $\lambda/4$ plate. Examples of such phase retarding components can be found in the technical articles "Complete polarization analysis of extreme ultraviolet radiation with a broadband phase retarder and analyzer" by Wang et al., Applied Phys. Letters 90, 081910 (2007) and "Soft-X-Ray polarimeter with multilayer optics: Complete analysis of the polarizations state of light" by Schäfers et al., Applied Optics, Vol. 38, No. 19, July 1999, pages 4074 to 4088. The phase retarding component 33 can be embodied as a multilayer structure, which will also be explained below.

The phase retarding component 33 has, on the two linearly polarized waves which are superimposed to form the polarization of the circularly polarized raw output beam 30, a phase shifting effect with a net phase shift of one quarter of the wavelength ($\lambda/4$) of the used output beam 3. A different embodiment of the transmissive phase retarding component 33 is also possible, in which the net phase shift is less than half a wavelength of the used output beam 3, for example in the range of between $\lambda/3$ and $\lambda/8$. In the calculation of the net phase shift, a phase shift having the magnitude of an integral multiple of $2\pi$ in the case of the difference between the phases of the two linearly polarized waves remains ineffective and is therefore not taken into consideration.

The transmissive phase retarding component 33 according to FIG. 2 having a net phase shift of $\lambda/4$ changes the polarization state of the raw output beam 30 having circular polarization 31 into a used radiation beam 3 having linear polarization (cf. polarization symbol 34 in FIG. 2). The used radiation beam 3 is polarized in the x-direction in the case of the embodiment according to FIG. 2. The direction of polarization of the linear polarization of the used radiation beam 3 runs perpendicularly to the propagation direction thereof. The direction of the linear polarization of the used radiation beam 3 is dependent on an alignment of an optical axis 35 that predefines the polarization influencing effect of the phase retarding component 33, the optical axis being depicted by way of example in FIG. 2.

For predefining a direction of the linear polarization 34 of the used radiation beam 3, the phase retarding component 33 can be pivoted about a pivoting axis that coincides with the propagation direction of the raw output beam 30 via a drive motor 36, which is indicated schematically in FIG. 2. A continuously variable predefinition of the linear polarization 34 of the used radiation beam 3 between a pure x-polarization and a pure y-polarization is thereby possible. For driving the phase retarding component 33, the latter can be mounted in its outer circumferential region, wherein the drive motor 36 then acts on this outer mount, for example via a gearwheel mechanism.

FIG. 3 shows a further embodiment of a phase retarding component 37. The latter is embodied as a reflective component. The reflective phase retarding component 37 bears a reflection coating 38, which, upon the raw output beam 31 passing through once, leads to a net phase shift which, in the case of the embodiment according to FIG. 3, is one eighth of the wavelength ($\lambda/8$) of the used output beam 3. Given a corresponding orientation of the optical axis 35 of the phase retarding component 37, this in turn leads to a linearly x-polarized used radiation beam 3, as indicated by the polarization symbol 34 in FIG. 3. The reflection coating 38 can be embodied as a multilayer coating, which will also be explained below.

In other embodiments of the reflective phase retarding component 37, the reflection coating can bring about a net phase shift in the range of between $\lambda/4$ and $\lambda/16$ or else an even smaller net phase shift.

Examples of reflective phase retarding components for EUV radiation are again mentioned in the two technical articles by Wang et al. and Schäfers et al. cited above.

For rotating or tilting the reflective phase retarding component 37, it is once again possible to use a drive motor 36, which is arranged on that side of the phase retarding component 37 which faces away from the raw output beam 30, that is to say on the mirror rear side. For setting a linear polarization direction 34 of the used radiation beam 3, the phase retarding component 37 can be pivoted about a rotation axis 39 via the drive motor 36, the rotation axis being perpendicular to a reflection surface of the phase retarding component 37 in the case of the "rotating" variant and being arranged as tilting axis (not illustrated) parallel to the reflection surface of the phase retarding component 37 in the case of the "tilting" variant.

Figure 4:
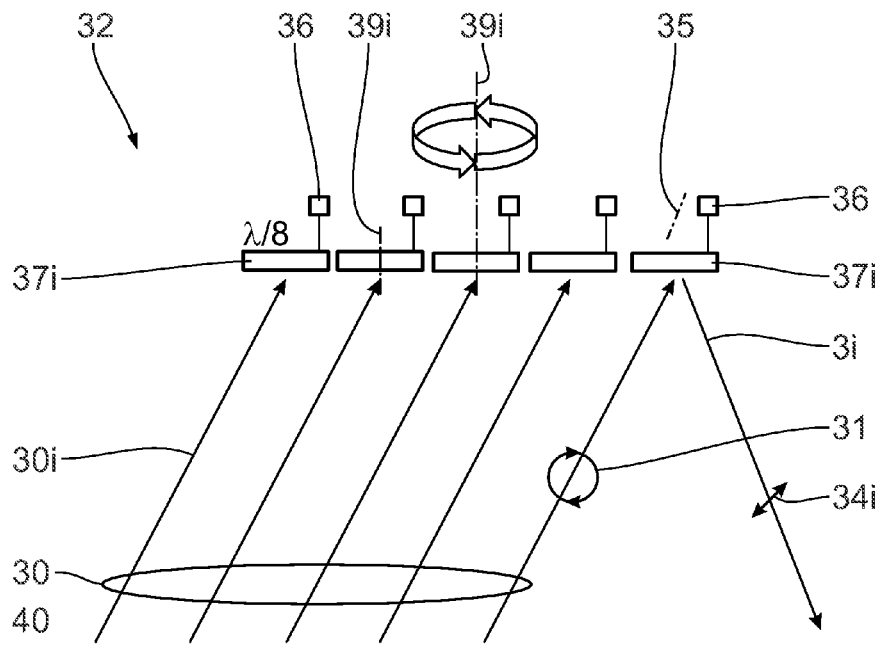
FIG. 4 shows an embodiment of the used polarization setting device having a plurality of reflective phase retarding components which each reflect different partial beams of an EUV raw output beam of the EUV light source.

FIG. 4 shows a further embodiment of the used polarization setting device 32. Components corresponding to those which have already been explained above with reference to FIGS. 1 to 3 bear the same reference numerals and will not discussed again in detail.

The used polarization setting device 32 according to FIG. 4 has a plurality of reflective phase retarding components 37i which each reflect different partial beams 30i of the raw output beam 30. Each of the phase retarding components 37i is embodied in the manner of the phase retarding component 37 according to FIG. 3.

Each of the phase retarding components 37i can be pivoted about a rotation axis 39i independently via an individually assigned drive motor 36, the rotation axis being perpendicular to the respective reflection surface of the phase retarding component 37i. Alternatively or additionally, each of the phase retarding components 37i can be tilted about a tilting axis (not illustrated) independently via an individually assigned drive motor 36, the tilting axis being arranged parallel to the respective reflection surface of the phase retarding component 37i. Consequently, the direction of the linear polarization 34i of each partial beam of the used radiation beam 3 which arises as a result of reflection of the corresponding partial beam 30i of the raw output beam 30 can be individually predefined. This is illustrated schematically in FIG. 4 on the basis of the reflected used partial beam 3i that is reflected from the phase retarding component 37i arranged furthest on the right in FIG. 4.

The phase retarding components 37i can be arranged in the form of a line or else in the form of an array. The number of phase retarding components 37i can be in the range of between 2 and more than 100. The number of phase retarding components 37i can be, for example, exactly equal to the number of field facets or pupil facets used during the polarization exposure within the illumination optical unit 5.

Figure 5:
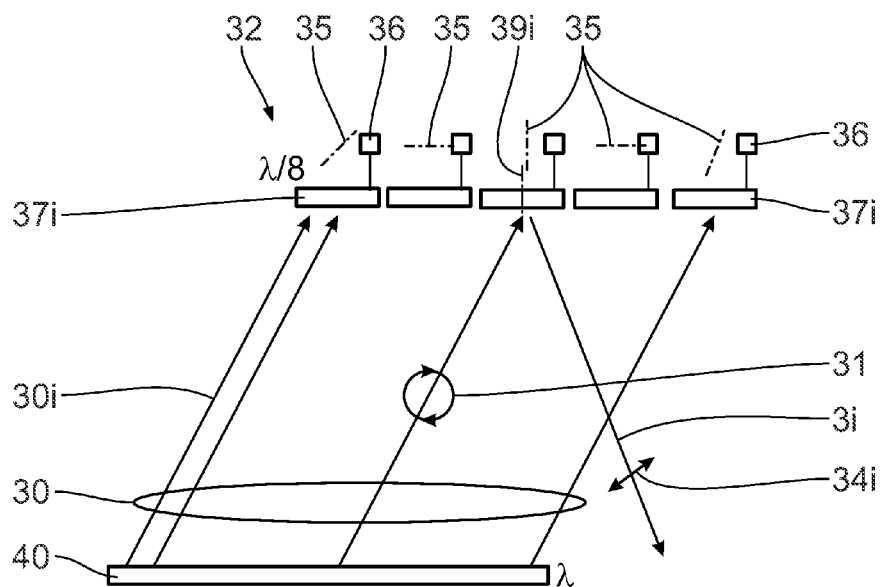
FIG. 5 shows a variant of an embodiment according to FIG. 4, wherein an optical selection component is arranged in the beam path of the raw output beam upstream of the plurality of reflective phase retarding components.

FIG. 5 shows a further embodiment of a used polarization setting device 32. Components corresponding to those which have already been explained above with reference to FIGS. 1 to 4 bear the same reference numerals and will not be discussed again in detail.

The phase retarding components 37i in the embodiment according to FIG. 5 differ in each case in the alignment of their optical axis 35 that predefines the phase influencing effect, which is illustrated schematically in FIG. 5. Accordingly, a respectively different linear polarization direction 34i of the different used partial beams 3i arises, depending on which of the reflective phase retarding components 37i in the embodiment according to FIG. 5 is impinged on by the raw output beam 30 or a partial beam 30i thereof.

In a variant of the used polarization setting device 32 according to FIG. 5, it has an optical selection component 40 in the beam path of the raw output beam 30 upstream of the reflective phase retarding components 37i. Via the optical selection component 40, which is illustrated extremely schematically in FIG. 5 and which can be a micromirror array having individually tiltable individual mirrors, it is possible to predefine which of the reflective phase retarding components 37i is impinged on by a given partial beam 30i of the raw output beam 30. By this approach, too, it is possible to generate a used radiation beam 3 having a predefined polarization distribution of partial beams 3i.

Figure 6:
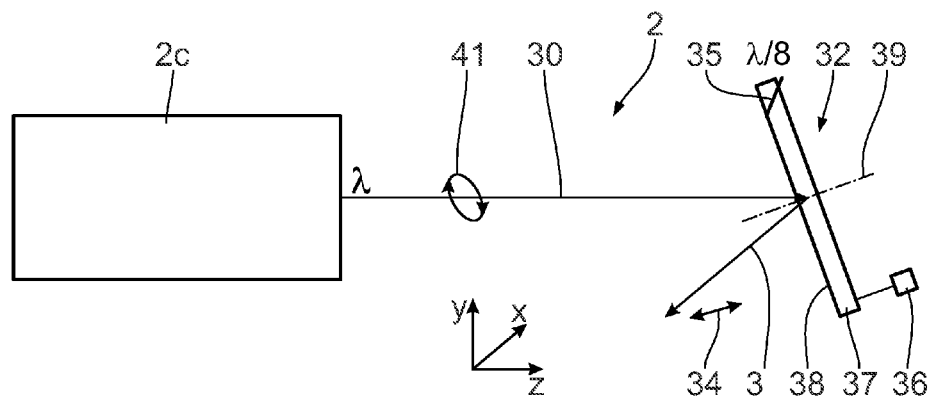
FIG. 6 shows, in an illustration similar to FIG. 3, an EUV light source comprising an EUV generation device that generates an elliptically polarized EUV raw output beam.

FIG. 6 shows a variant of the EUV light source in which an elliptically polarized raw output beam 30 is generated by the EUV generation device 2c, which is indicated by a corresponding polarization symbol 41 in FIG. 6. In order to convert this elliptically polarized raw output beam 30 into a linearly polarized used radiation beam 3, the reflective phase retarding component 37 can have a net phase shift which deviates from $\lambda/8$ and can be less, for example, and can be, in particular, less than $\lambda/10$.

Figure 7:
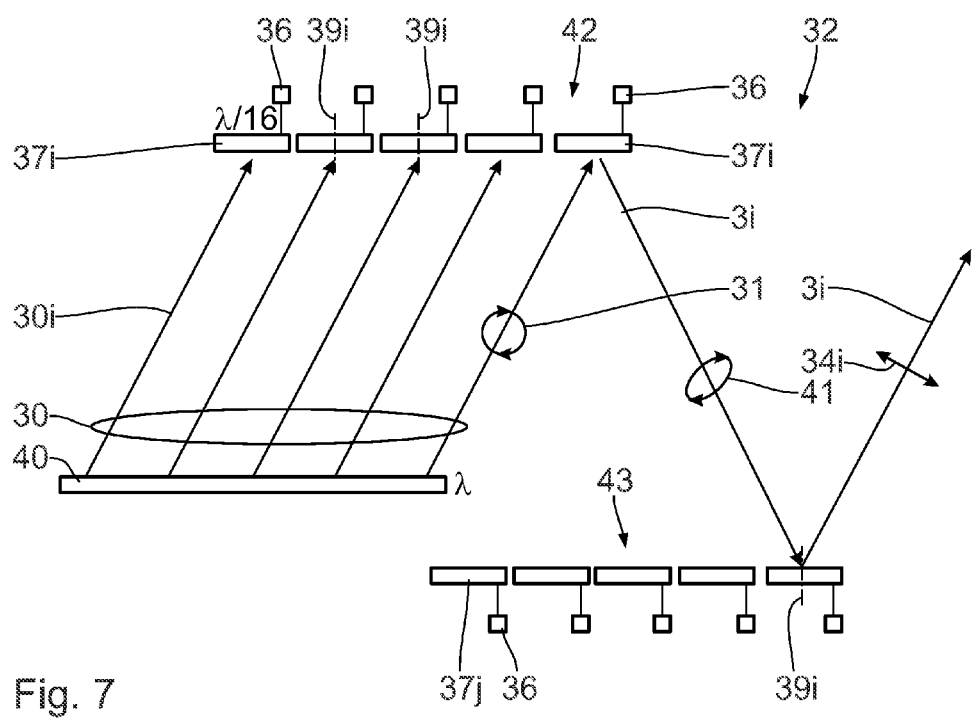
FIG. 7 shows, in an illustration similar to FIG. 4, a used polarization setting device in which a plurality of reflective phase retarding components, namely two reflective phase retarding components, each reflect the same partial beam of the raw output beam.

FIG. 7 shows an embodiment of the used polarization setting device 32 with reflective phase retarding components 37i and 37j embodied in the form of two mirror arrays 42, 43 arranged one behind the other in the beam path of the raw output beam 30. A partial beam 30i of the raw output beam 30 is in each case reflected successively by one of the phase retarding components 37i of the mirror array 42 and by a phase retarding component 37j of the mirror array 43. The individual phase retarding components 37i, 37j can be embodied with a very small net phase shift, for example with a net phase shift which is less than $\lambda/10$ and which can be, in particular, $\lambda/16$. This case is illustrated in FIG. 7. As a result of reflection at the phase retarding components 37i with a net phase shift of $\lambda/16$, the circularly polarized raw output partial beam 30i becomes an elliptically polarized raw output partial beam. The latter is converted into a linearly polarized used partial beam 3i by further reflection at the phase retarding component 37j.

In the latter case, the phase retarding components 37i, 37j can simultaneously constitute the facets of a respective facet mirror of the illumination optical unit 5. The field facet mirror 8 can then have the phase retarding components 37i, for example, and the pupil facet mirror 9 the phase retarding components 37j.

All of the EUV mirror surfaces can bear a highly reflective coating for the used EUV wavelengths in the range of between 5 nm and 30 nm. The coatings can be multilayer coatings. The multilayer coatings can be fashioned as alternating multilayers of two different layer materials, for example as a sequence of molybdenum/silicon bilayers.

The developments described above in connection with the at least one reflective phase retarding component can also be realized in the case of a transmissive phase retarding component. This also applies, in particular, to the various configurations of the used polarization setting device that influences partial beams of the raw output beam.

FIGS. 8 and 9 show, on an exaggerated enlarged scale, a multilayer construction of the phase retarding components 33 according to FIGS. 2 and 37 according to FIG. 3. Components corresponding to those which have already been explained above with reference to FIGS. 1 to 7 bear the same reference numerals and will not be discussed in detail again. The respective multilayer arrangement comprises a multiplicity of individual layers 44, 45 composed of different materials. The different materials of the individual layers 44, 45 are arranged in a manner alternating with one another, that is to say alternately in the case of exactly two materials. The individual layers 44 are composed of molybdenum in the embodiments according to FIGS. 8 and 9. The individual layers 45 are composed of silicon in the embodiments according to FIGS. 8 and 9. Other materials, for example ruthenium and/or boron carbide, can also be used for the individual layers 44 and/or 45. A total layer thickness D is in the range of between 100 nm and 1 μm. The number of individual layers 44, 45 is 17 in the embodiments illustrated in FIGS. 8 and 9. A different number of individual layers 44, 45 in the range of between 10 and 200, for example in the range of between 10 and 100 or between 20 and 50, can also be chosen depending on the use conditions. A thickness d of the individual layers 44 or 45 is dependent on the wavelength of the used radiation 3 and also on the angle of incidence of the raw output beam 30 on the phase retarding component 33 or 37.

Two further variants of the used polarization setting device 32 are explained in greater detail below with reference to FIGS. 10 and 11. Components corresponding to those which have already been discussed above in particular with reference to FIGS. 1 to 9 once again bear the same reference numerals and will not be discussed in detail again.

The first facet mirror 8 in the illumination optical unit 5 in the embodiment according to FIG. 10 has a plurality of individual mirrors 46 which provide illumination channels for guiding partial beams $30_i$ of the raw output beam toward the object field or illumination field 14. The EUV mirrors downstream of the second facet mirror 9 are omitted in the illumination optical unit 5 according to FIG. 10. The individual mirrors 46 are arranged on an individual-mirror carrier 46a. The individual-mirror carrier 46a is designed to be rotationally symmetrical with respect to an axis k of incidence of the circularly polarized raw illumination light 30, the axis being parallel to the z-axis. The individual-mirror carrier 46a is embodied with a round carrier surface 47 arranged parallel to the xy-plane. The individual-mirror carrier 46a lies spatially between the incident raw output beam 30 and the object field 14.

The individual mirrors 46 can have square or rectangular reflection surfaces arranged in a closely packed manner on the individual-mirror carrier 46a. Other forms of individual mirrors which enable the reflection surface of the first facet mirror 8 to be occupied as far as possible without gaps can also be used. Such alternative individual-mirror forms are known from the mathematical theory of tiling. In this connection, reference should be made to the references indicated in US 2011/0001947 A1.

Depending on the embodiment of the first facet mirror 8, the individual mirrors 46 have x/y-extents in the range of from, for example, 100 μm×100 μm to, for example, 5 mm×5 mm. The individual mirrors 46 can be shaped such that they have a focusing effect for the raw output beam 30.

The individual mirrors 46 can have an arrangement on the individual-mirror carrier 46a which is rotationally symmetrical with respect to the axis k of incidence of the raw output beam 30. This arrangement can be embodied for example in a plurality of concentric rings of individual mirrors 46 on the individual-mirror carrier 46a, wherein the center of this individual-mirror arrangement coincides with an intersection point of the axis k of incidence of the raw output beam 30 through the carrier surface 47.

In the meridional section according to FIG. 10, by way of example, four of the individual mirrors 46 are illustrated. In a real embodiment of a first facet mirror 8, the number of individual mirrors 46 is very much higher. In total, the first facet mirror 8 has hundreds to thousands of the individual mirrors 46.

A total reflection area of the first facet mirror 8, composed of the reflection surfaces of the individual mirrors 46, has an extent of, for example, 300 mm×300 mm or 600 mm×600 mm depending on the embodiment of the first facet mirror 8.

Each of the individual mirrors 46, for the purpose of individually deflecting the partial beam $30_i$ of the impinging raw output beam 30, is connected in each case to an actuator 48, as indicated on the basis of the topmost individual mirror 46 illustrated in FIG. 10. The actuators 48 are arranged on that side of each of the individual mirrors 46 which faces away from a reflective side of the individual mirrors 46. The actuators 48 can be embodied as piezo-actuators, for example. Configurations of such actuators are known from the construction of micromirror arrays.

The actuators 48 are signal-connected to a central control device 48a in a manner not illustrated, via which central control device the actuators 48 can be driven for individually tilting the individual mirrors 46.

Each of the individual mirrors 46 is individually independently tiltable about two mutually perpendicular tilting axes, wherein a first of these tilting axes runs parallel to the x-axis and the second of these two tilting axes runs parallel to the y-axis. The two tilting axes lie in the individual reflection surfaces of the respective individual mirrors 46.

The reflection surfaces of the individual mirrors 46 bear multilayer reflection coatings in the manner of those which have been explained above in connection with the multilayer construction according to FIG. 9. A birefringent effect of these multilayer arrangements on the individual mirrors 46 is such that, upon the respective partial beam $30_i$ of the raw output beam 30 passing through once, a net phase shift of λ/16 results, which leads to a birefringent effect of λ/8 upon the reflection at the individual mirrors 46.

The embodiment according to FIG. 10 is particularly suitable for birefringently influencing a circularly polarized EUV raw output beam 30.

The individual mirrors 46 of the first facet mirror 8 have a birefringent effect such that the respective partial beam 30i of the raw output beam is firstly elliptically polarized (polarization symbol 41), upon the reflection of the partial beam 30i of the raw output beam at this individual mirror 46.

The second facet mirror 9 is disposed downstream of the first facet mirror 8 in the beam path of the illumination light 3 (cf. FIG. 10). A respective facet 49 of the second facet mirror 9 together with at least one of the individual mirrors 46 of the first facet mirror 8 completes the illumination channel for guiding the illumination light partial beam $3_i$ toward the illumination field 14. In general, the arrangement is such that one of the facets 49 of the second facet mirror 9 together with a group of the individual mirrors 46 of the first facet mirror 8 completes a group illumination channel for a plurality of partial beams $30_i$, to which channel this facet 49 of the second facet mirror 8 and a group of individual mirrors 46 of the first facet mirror 8 belong. Therefore, this group of the individual mirrors 46 of the first facet mirror 8 guides illumination light partial beams $3_i$ all via exactly the same facet 49 of the second facet mirror 9 toward the illumination field 14.

The facets 49 of the second facet mirror 9 in turn bear multilayer reflection coatings constructed in the manner of the multilayer construction according to FIG. 9. These reflection coatings of the facets 49 have a birefringent effect in such a way that, upon the partial beams passing through once, a net phase shift of $\lambda/16$ results, which, upon the reflection of the partial beams at the facets 9, then leads to a total net phase shift of $\lambda/8$. Upon the reflection of the raw partial beams at the facets 49, the elliptically polarized raw partial beams are linearly s-polarized and thus produce the illumination light partial beams $3_i$. The s-polarization involves the direction of polarization of the illumination light partial beam $3_i$ which oscillates perpendicularly to the plane of incidence (plane of the drawing in FIG. 10) of the facet 49. The s-polarization is indicated by circles marked with crosses in FIG. 10. The s-polarization is alternatively (cf. FIG. 11) represented by large dots on the beam path of the respective illumination light partial beam $3_i$.

As a result of the double reflection of the partial beam $30_i$, one time at one of the individual mirrors 46 and a second time at one of the facets 49 of the second facet mirror 9, an almost complete or even wholly complete s-polarization results in the case of the illumination light partial beam $3_i$ impinging on the illumination field 14.

The facets 49 of the second facet mirror 9 are arranged on a facet carrier 50, which is indicated by dashed lines in FIG. 10. The facet carrier 50 is of ring-shaped design. The facet carrier 50 is designed to be rotationally symmetrical with respect to the axis k of incidence of the illumination light 3. The arrangement of the facets 49 of the second facet mirror 9 on the facet carrier 50 is correspondingly rotationally symmetrical.

The illumination optical unit 5 is arranged overall in a manner rotationally symmetrical with respect to the axis k of incidence. The axis k of incidence passes through a center of the illumination field 14. The axis k of incidence is perpendicular to the object plane 15.

The rotational symmetry of the arrangement of the individual mirrors 46 of the first facet mirror 8 and of the facets 49 of the second facet mirror 9 enables beam guiding of the raw output beam partial beams $30_i$, and of the used illumination light partial beams $3_i$, which is rotationally symmetrical to a good approximation in any case with respect to the axis k of incidence.

Facets 49 of the second facet mirror 9 which are provided for reflecting partial beams deflected by individual mirrors 46 of the first facet mirror 8 in the xz-plane are illustrated by dashed lines at the level of the axis k of incidence in FIG. 10. On account of the ring-shaped configuration of the facet carrier 50, these field facets 49 are, of course, at a distance from the axis k of incidence both in the positive and in the negative x-direction correspondingly with respect to the plane of the drawing in FIG. 10. Corresponding facets 49 are arranged in a manner distributed uniformly in the circumferential direction around the axis k of incidence on the facet carrier 50, thus resulting in the fundamentally rotationally symmetrical reflection arrangement for the illumination light partial beams $30_i$ and $3_i$. An illumination with tangentially polarized used illumination light 3 results for every point on the illumination field 5. This is illustrated in greater detail for an illumination field point 51 in FIG. 10.

From every illumination direction the used illumination light 3 impinges with s-polarization on the illumination field point 51. Since, on account of the ring-shaped arrangement of the field facets 49, the illumination field point 51 is illuminated with a ring-shaped illumination angle distribution 52 (the illumination field point 51 "sees" a ring-shaped light source), at every location of this ring-shaped illumination angle distribution 52, indicated by a perspective circle in FIG. 10, an s-polarization arises which is complemented to form a tangential polarization. At every location of the ring-shaped illumination angle distribution 52, a polarization vector 52a oscillates tangentially with respect to the illumination angle distribution 52.

On account of this tangential polarization, the reticle 17 in the illumination field 14 can be illuminated with s-polarized used illumination light 3 independently of the illumination angle. This illumination enables an optimized structure resolution when the illumination optical unit 5 is used as part of the projection exposure apparatus 1.

The facet mirrors 8 and 9 simultaneously constitute the used polarization setting device 32 of the illumination optical unit 5.

With the illumination optical unit 5, the illumination field 14 can be illuminated with illumination angles which are greater than a lower limit value for the illumination angle, which is predefined by a central shading of the beam path of the illumination light 30 or 3, the shading being predefined by the individual-mirror carrier 46a.

An annular illumination setting or else a multipole illumination setting, e.g. a dipole illumination setting or a quadrupole illumination setting, e.g. a C-quad illumination setting, can be realized with the illumination optical unit 5.

FIG. 11 shows, in a manner similar to FIG. 10, an excerpt from the illumination optical unit 5. The latter is embodied such that it guides the EUV raw output beam 30 of an EUV light source 53, which is embodied as an alternative to the electron-beam-based EUV light source 2, toward the object field 14. The EUV light source 53 can be a plasma source, for example a GDPP (Gas Discharge Produced Plasma) source or an LPP (Laser Produced Plasma) source. Components and functioning corresponding to those which have already been explained above with reference to FIGS. 1 to 5 bear the same reference numerals and will not be discussed in detail again.

The EUV raw output beam 30, which emerges with circular polarization from the radiation source 53, is focused by a collector 54. A corresponding collector is known from EP 1 225 481 A, for example.

Downstream of the collector 54, the EUV raw radiation beam 30 propagates through an intermediate focus 55 before it impinges on an individual-mirror array 56. The individual-mirror array 56 is designed as a micro electromechanical system (MEMS). It has a multiplicity of individual mirrors 57 arranged in a matrix-like manner in rows and columns in an array, two individual mirrors 57 of which are illustrated schematically in FIG. 11. The individual mirrors 57 can have square or rectangular reflection surfaces. The individual mirrors 57 are respectively connected to actuators 58 and designed to be tiltable about two axes perpendicular to one another in the reflection plane of the respective individual mirror 57. The actuators 58 are signal-connected to a central control device 48*a* in a manner not illustrated, via which central control device the actuators 58 can be driven for individually tilting the individual mirrors 57.

The number of individual mirrors 57 of the individual-mirror array 56 is illustrated in a very greatly understated manner in the drawing. In total, the individual-mirror array 56 has approximately 100 000 of the individual mirrors 57. Depending on the size of the individual mirrors 57, the individual-mirror array can also have for example 1000, 5000, 7000 or else hundreds of thousands of individual mirrors, for example 500 000 individual mirrors 57. The number of individual mirrors 57 can alternatively also be significantly smaller, for example a few hundred individual mirrors, for example 200, 250, 300 or 500 individual mirrors. Insofar as many of the individual mirrors 57 are present, the latter can be combined in groups, wherein in each case identical individual-mirror tilting angles are present within one of the individual-mirror groups. The individual mirrors 57 can have a highly reflective multilayer optimized for the respective angle of incidence and the wavelength of the EUV used light 3.

A spectral filter can be arranged upstream of the individual-mirror array 56, which spectral filter separates the used EUV raw radiation beam 30 from other wavelength components of the emission of the radiation source 53 that cannot be used for the projection exposure. The spectral filter is not illustrated.

Downstream of the individual-mirror array 56, the EUV raw radiation beam 30 impinges on a field facet mirror 8. The field facet mirror 8 is arranged in a plane of the illumination optical unit 5 that is optically conjugate with respect to the object plane 15.

Downstream of the field facet mirror 8, the EUV radiation beam 3 is reflected by a pupil facet mirror 9. The pupil facet mirror 9 lies either in an entrance pupil plane of the illumination optical unit 5 or in a plane that is optically conjugate with respect thereto. The field facet mirror 8 and the pupil facet mirror 9 are in each case constructed from a multiplicity of facets, also designated as honeycombs. Field facets 60 of the field facet mirror 8 are imaged into the object field 14 by a transfer optical unit, which either is formed by the pupil facet mirror 9 or includes further components between the pupil facet mirror 9 and the object field 14. Each of the field facets 60, provided that it is completely illuminated with the illumination light 3, is in this case imaged into the entire object field 14. The field facets 60 are arranged on a ring-shaped facet mirror carrier 61, indicated schematically in FIG. 1.

The EUV raw output beam 30 impinges on the individual-mirror array 56 at an angle of incidence which is less than 70°, that is to say not with grazing incidence. Grazing incidence is also possible, in principle. The field facets 60 of the field facet mirror 8 and pupil facets 62 of the pupil facet mirror 9 bear multilayer reflection coatings coordinate with the wavelength of the used light 3. The pupil facets 62 can be embodied as round, hexagonal or rectangular.

Only some of the field facets 60 and some of the pupil facets 62 of the facet mirrors 8, 9 are illustrated schematically and in an exaggerated enlarged view in FIG. 11. The field facet mirror 8 has thousands of field facets 60, for example 3000 field facets 60. The pupil facet mirror 9 has thousands of pupil facets 62, for example 3000 pupil facets 62. The number of field facets 60 of the field facet mirror 8 can be equal to the number of pupil facets 62 of the pupil facet mirror 9.

The pupil facet mirror 9 is arranged in a plane of the illumination optical unit 5 which constitutes a pupil plane of the projection optical unit 16 or is optically conjugate with respect to a pupil plane of the projection optical unit 16. With the aid of the pupil facet mirror 9 or the transfer optical unit, the field facets 60 of the field facet mirror 8 are imaged into the object field 14 in a manner undergoing superimposition on one another.

The field facets 60 of the field facet mirror 8 have an x/y aspect ratio corresponding to the x/y aspect ratio of the object field 14. The field facets 60 therefore have an x/y aspect ratio that is greater than 1. A long facet side of the field facets 60 runs in the x-direction. A short facet side of the field facets 60 runs in the y-direction (scanning direction).

The arrangement of the illumination optical unit 5 is such that the intermediate focus 55 is imaged, via illumination channels which are formed by in each case at least one of the individual mirrors 57 and at least one of the field facets 60 and which guide a partial beam of the illumination light 3, into a spatial region in which the pupil facets 62 are situated. An intermediate focus image 63 thus arises on each of the pupil facets 62. Depending on how many of the individual mirrors 57 contribute to the respective illumination channel, the intermediate focus image 63 can arise as a superimposition of a plurality of intermediate focus images which arise in the respective pupil facet 62 on account of the guidance of the illumination light 3 via in each case one of the individual mirrors 57. The intermediate focus image 63 in this case need not arise exactly on the pupil facet 62 of the respective illumination channel. It suffices if the respective pupil facet 62 is situated in the region of the intermediate focus image 63, such that the intermediate focus image 63 is located in particular completely on the pupil facet 62.

Depending on whether the pupil facets 62 are parts of the transfer optical unit which images the field facets 60 into the object field 14, the pupil facets 62 either have an imaging effect, that is to say are fashioned convexly, in particular, or are embodied as pure deflection or plane mirrors. The pupil facets 62 can bear correction aspheres for correcting imaging aberrations of the illumination optical unit 5.

The number of individual mirrors 57 is at least equal to the number of field facets 60. In the case of the embodiment according to FIG. 11, the number of individual mirrors 57 is actually much greater than the number of field facets 60 and can be, in particular, ten times greater or even greater still. The configuration of the illumination optical unit 5 is such that the individual-mirror array 56 is not imaged onto the field facets 60, nor onto the pupil facets 62.

The field facets 60 and the pupil facets 62 are arranged in such a way that the illumination channels which are formed in each case by exactly one of the field facets 60 and exactly one of the pupil facets 62, which are aligned in each case for guiding a partial beam 3; of the illumination light 3, are fixedly assigned in each case to a facet pair 60, 62 including the field facet 60 and the pupil facet 62. An illumination beam path 64 is therefore fixedly predefined in the illumination optical unit 5 starting from the field facet mirror 8. A variation of the illumination is brought about exclusively via tilting of the individual mirrors 57 of the individual-mirror array 56, wherein the individual-mirror array 56 is used to select which of the field facets 60 are impinged on by the illumination light 3, if appropriate in sections.

In the case of the illumination optical unit 5 according to FIG. 11, the pupil facets 62 of the pupil facet mirror 9 are embodied such that they are plane. A relay optical unit in the form of a concave mirror 65 serves as a transfer optical unit for imaging the field facets 60 of the field facet mirror 8 into the object field 14.

In the case of the illumination optical unit 5, the reflection surfaces of the pupil facets 62 can optionally be configured as correction aspheres in order to correct imaging aberrations of the imaging by the concave mirror 65.

In the case of the illumination beam path 64 of the illumination optical unit 5 according to FIG. 11, the illumination light 3 is guided between the concave mirror 65 and the object field 14 through a passage opening 66 of the field facet mirror carrier 61, through which the illumination light 3 is also guided in the illumination beam path 64 between the pupil facet mirror 9 and the concave mirror 65.

In addition, in the case of the illumination optical unit according to FIG. 11, the raw output beam 30 is guided between the intermediate focus 55 and the individual-mirror array 56 through the passage opening 66.

A used polarization setting device 32 of the illumination optical unit 5 is in turn realized by the field facet mirror 8 and the pupil facet mirror 9 according to FIG. 11. The facets 60, 62 of the facet mirrors 8, 9 bear multilayer reflection coatings in the manner of those which have been explained above in connection with the multilayer construction according to FIG. 9. The facets 60, 62 of the facet mirrors 8, 9 have in reflection once again a net phase shifting effect of λ/8, such that the circularly polarized raw illumination light 30 (cf. polarization symbol 31) is converted firstly into elliptical polarized illumination light (cf. polarization symbol 41 in FIG. 11) and then in turn into linearly polarized illumination light 3. With this used polarization setting device 42 according to FIG. 11, it is likewise possible to realize a tangential polarization distribution in the illumination of the object field 14, as already explained above. In the plane of the drawing in FIG. 11, for example, the illumination light partial beams 3$i$ in the beam path upstream of the object field 14 are correspondingly s-polarized.

The used polarization setting devices 32 explained above can be part of the light source 2 or alternatively part of the illumination optical unit 5.

During the production of a micro- or nanostructured component via the projection exposure apparatus 1, firstly the reticle 17 and the wafer 22 are provided. Subsequently, a structure on the reticle 17 is projected onto a light-sensitive layer of the wafer 22 with the aid of the projection exposure apparatus 1. As a result of the development of the light-sensitive layer, a micro- or nanostructure is produced on the wafer 22 and the micro- or nanostructure component is thus produced, for example a semiconductor component in the form of a memory chip.

The invention claimed is:

1. A light source, comprising:
   a generation device configured to generate a first EUV beam having a polarization that is a superimposition of two linearly polarized waves with directions of polarization that are perpendicular to each other and that have a phase difference with respect to each other that is non-zero and not an integral multiple of π; and
   a polarization setting device configured to interact with the first EUV beam to provide a second EUV beam by exerting an effect on the first EUV beam that is linearly polarizing with respect to the direction of polarization to set a polarization of the second EUV beam,
   wherein the polarization setting device comprises a phase retarding component in a beam path of the first EUV beam, and the polarization setting device is configured to exert a phase shifting effect on the two linearly polarized waves of the first EUV beam, and
   wherein the phase retarding component comprises a plurality of reflective phase retarding components configured to reflect the same partial beam of the first EUV beam.

2. The light source of claim 1, wherein a net phase shift between the two linearly polarized waves of the first EUV beam is less than half a wavelength of the second EUV beam.

3. The light source of claim 1, wherein at least one of the phase retarding components comprises a reflection coating configured so that, during use of the light source when the first EUV beam passes through the reflection coating once, the reflection coating leads to a net phase retardation of less than one quarter of a wavelength of the second EUV beam.

4. The light source of claim 1, wherein at least one of the phase retarding components comprises a reflection surface, and the at least one phase retarding component is rotatable about an axis that is perpendicular to the reflection surface of the phase retarding component.

5. A device, comprising:
   a light source according to claim 1,
   wherein the device is a polarization setting device configured to influence a polarization of the first EUV beam to provide the second EUV beam.

6. An illumination system, comprising
   a light source; and
   an illumination optical unit,
   wherein:
      the light source, comprises:
         a generation device configured to generate a first EUV beam having a polarization that is a superimposition of two linearly polarized waves with directions of polarization that are perpendicular to each other and that have a phase difference with respect to each other that is non-zero and not an integral multiple of π; and
         a polarization setting device configured to interact with the first EUV beam to provide a second EUV beam by exerting an effect on the first EUV beam that is linearly polarizing with respect to the direction of polarization to set a polarization of the second EUV beam;
      the polarization setting device comprises a phase retarding component in a beam path of the first EUV beam;
      the polarization setting device is configured to exert a phase shifting effect on the two linearly polarized waves of the first EUV beam;
      the light source is configured to provide the second EUV beam to the illumination unit; and
      the illumination unit is configured to illuminate a reticle plane.

7. An optical system, comprising:
   a light source;
   an illumination optical unit; and
   a projection optical unit,
   wherein:
      the light source, comprises:
         a generation device configured to generate a first EUV beam having a polarization that is a superimposition of two linearly polarized waves with directions of polarization that are perpendicular to each other and that have a phase difference with respect to each other that is non-zero and not an integral multiple of $\pi$; and a polarization setting device configured to interact with the first EUV beam to provide a second EUV beam by exerting an effect on the first EUV beam that is linearly polarizing with respect to the direction of polarization to set a polarization of the second EUV beam;

the polarization setting device comprises a phase retarding component in a beam path of the first EUV beam;

the polarization setting device is configured to exert a phase shifting effect on the two linearly polarized waves of the first EUV beam;

the light source is configured to provide the second EUV beam to the illumination optical unit;

the illumination optical unit is configured to illuminate an object field; and the projection optical unit is configured to image the object field into an image field.

8. A method of using an optical system comprising an illumination optical unit and a projection optical unit, the method comprising:

generating a first EUV beam having a polarization for generating a first EUV beam that is a superimposition of two linearly polarized waves with directions of polarization that are perpendicular to each other and that have a phase difference with respect to each other that is non-zero and not an integral multiple of $\pi$;

interacting the first EUV beam with a polarization setting device to provide a second EUV beam by exerting an effect on the first EUV beam that is linearly polarizing with respect to the direction of polarization to set a polarization of the second EUV beam;

providing the second EUV beam to the illumination optical unit;

using the illumination system to illuminate an object field with the second EUV beam; and using the projection optical unit to image the object field onto an image field.

9. An illumination system, comprising:

a light source comprising a generation device configured to generate a first EUV beam having a polarization that is a superimposition of two linearly polarized waves with directions of polarization that are perpendicular to each other and that have a phase difference with respect to each other that is non-zero and that is not an integral multiple of $\pi$; and an illumination optical unit comprising a polarization setting device configured to interact with the first EUV beam to provide a second EUV beam by exerting an effect on the first EUV beam that is linearly polarizing with respect to the direction of polarization to set a polarization of the second EUV beam, wherein:
the polarization setting device comprises a phase retarding component in a beam path of the first EUV beam;

the polarization setting device is configured to exert a phase shifting effect on the two linearly polarized waves of the first EUV beam; and the illumination optical unit is configured to illuminate a reticle plane with the second EUV beam.

10. An optical system, comprising:

an illumination system according to claim 9; and a projection optical unit configured to image the illumination field into an image field.

11. A method of using an optical system comprising an illumination system and a projection optical unit, the method comprising:

using the illumination system to illuminate a reticle plane; and using the projection optical unit to image the reticle plane onto an image plane, wherein the illumination system comprises an illumination system according to claim 9.

* * * * *